(12) United States Patent
Jeon et al.

(10) Patent No.: US 9,780,047 B1
(45) Date of Patent: Oct. 3, 2017

(54) SEMICONDUCTOR PACKAGE

(71) Applicant: SAMSUNG ELECTRO-MECHANICS CO., LTD., Suwon-si (KR)

(72) Inventors: Young Ho Jeon, Suwon-si (KR); Il Hyeong Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/358,527

(22) Filed: Nov. 22, 2016

(30) Foreign Application Priority Data

Apr. 4, 2016 (KR) .................. 10-2016-0040955

(51) Int. Cl.
*H01L 23/48* (2006.01)
*H01L 23/60* (2006.01)
*H01L 23/31* (2006.01)
*H01L 23/498* (2006.01)

(52) U.S. Cl.
CPC .......... *H01L 23/60* (2013.01); *H01L 23/3121* (2013.01); *H01L 23/49811* (2013.01); *H01L 23/49827* (2013.01)

(58) Field of Classification Search
CPC ....... H01L 23/04; H01L 21/561; H01L 24/05; H01L 21/78
See application file for complete search history.

(56) References Cited

U.S. PATENT DOCUMENTS 7,342,303 B1 3/2008 Berry et al.
2013/0127025 A1 5/2013 Cho

FOREIGN PATENT DOCUMENTS

JP 2011-124366 A 6/2011
KR 10-2013-0056570 A 5/2013

OTHER PUBLICATIONS

Korean Office Action dated May 12, 2017 in corresponding Korean Patent Application No. 10-2016-0040955 (11 pages in English and 7 pages in Korean).

*Primary Examiner* — Samuel Gebremariam
(74) *Attorney, Agent, or Firm* — NSIP Law

(57) ABSTRACT

A semiconductor package includes: a first substrate including a first ground conductor disposed on at least a second surface of a first surface and the second surface; a plurality of electronic elements mounted on the first surface and the second surface of the first substrate; a second substrate adhered to the second surface of the first substrate and including a penetration part formed to accommodate the plurality of electronic elements mounted on the second surface of the first substrate and a second ground conductor connected to the first ground conductor; a molded portion encapsulating the plurality of electronic elements mounted on the first surface of the first substrate; and a shielding layer formed on outer surfaces of the molded portion and the first substrate and at least a portion of a side surface of the second substrate to shield electromagnetic waves.

10 Claims, 7 Drawing Sheets

SEMICONDUCTOR PACKAGE

CROSS-REFERENCE TO RELATED APPLICATION(S)

This application claims the benefit under 35 USC 119(a) of Korean Patent Application No. 10-2016-0040955 filed on Apr. 4, 2016 in the Korean Intellectual Property Office, the entire disclosure of which is incorporated herein by reference for all purpose.

BACKGROUND

1. Field

The present disclosure relates to a semiconductor package having improved electromagnetic characteristics in a double-sided mounting type semiconductor package.

2. Description of Related Art

In order to realize the miniaturization and lightening of recent electronic elements, a system-on-chip (SOC) technology of implementing a plurality of individual elements on a single chip, a system-in-package (SIP) technology of integrating a plurality of individual elements in a single package, or the like, as well as a technology of decreasing the sizes of individual mounting components is required.

Further, in order to manufacture a semiconductor package having high performance while having a small size, a structure in which electronic components are mounted on the first surface and the second surface of a substrate has been developed.

In a case of mounting electronic components on the first surface and the second surface of the substrate, a double-sided mounting type semiconductor package allowing an external connection terminal to be easily formed in a state in which the electronic components are mounted on the first surface and the second surface of the substrate has been required.

However, an problem with electromagnetic waves has been prominent as a core problem in next-generation electronic devices to which the semiconductor package is applied, and as the results of research have indicated electromagnetic interference causes malfunctioning of the electronic devices and electromagnetic waves have a negative influence on the human body, interest in electromagnetic waves, in addition to concerns regarding the effects of electromagnetic waves on human health have been increased.

Among semiconductor packages in an existing radio frequency (RF) module, or the like, a semiconductor package using a shield can formed of metal in order to protect an internal integrated circuit (IC), a device element, or the like, from electromagnetic waves and external impacts may be provided.

However, in the case of the using such a shield can, since a space for mounting the shield can should be secured in a surface of the semiconductor package, and the shield can should also be manufactured to have a height higher than those of the internal elements, there may be a limitation in miniaturizing and lightening the semiconductor package.

In order to overcome the disadvantage as described above, a molding technology using an epoxy, an encapsulant material, may be applied instead of the shield can, but in a case of using the mold, a method capable of ensuring protection of internal elements and ICs from electromagnetic waves penetrating thereinto or being radiated thereinto should also be provided.

A solution for solving the above-mentioned technical problems has not been disclosed in Korean Patent Laid-Open Publication No. 2013-0056570.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package may include: a first substrate including a first ground conductor disposed on at least a second surface of a first surface and the second surface; a plurality of electronic elements mounted on the first surface and the second surface of the first substrate; a second substrate adhered to the second surface of the first substrate and including a penetration part formed to accommodate the plurality of electronic elements mounted on the second surface of the first substrate and a second ground conductor connected to the first ground conductor; a molded portion encapsulating the plurality of electronic elements mounted on the first surface of the first substrate; and a shielding layer formed on outer surfaces of the molded portion and the first substrate and at least a portion of a side surface of the second substrate to shield electromagnetic waves, wherein the shielding layer is connected to the second ground conductor of the second substrate.

The second ground conductor of the second substrate may include: a first connection conductor connected to the first ground conductor; an internal ground conductor formed on an internal layer of the second substrate and connected to the shielding layer; a second connection conductor formed for an external connection; and a conductor via connecting the first connection conductor, the internal ground conductor, and the second connection conductor to one another.

The second ground conductor of the second substrate may include: a first connection conductor connected to the first ground conductor; a first internal ground conductor formed on a first internal layer of the second substrate; a second internal ground conductor formed on a second internal layer of the second substrate; a second connection conductor formed for an external connection; and a conductor via connecting the first connection conductor, the first internal ground conductor, the second internal ground conductor, and the second connection conductor to one another, at least one of the first and second internal ground conductors being connected to the shielding layer.

The second substrate includes a first shield via formed therein to be spaced apart from the shielding layer formed on the side surface of the substrate, and connecting the first and second internal ground conductors to each other.

The second substrate further includes a shield via disposed adjacently to the penetration part of the second substrate, the shielding via may include: a first conductor formed on the first internal layer; a second conductor formed on the second internal layer; and a second shield via connecting the first and second conductors to each other.

In another general aspect, a semiconductor package may include: a first substrate including a first ground conductor and a first signal conductor which are separately formed on at least a second surface of a first surface and the second surface of the first substrate; a plurality of electronic elements mounted on the first surface and the second surface of the first substrate to thereby be connected to the first signal conductor; a second substrate adhered to the second surface of the first substrate and including a penetration part formed to accommodate the plurality of electronic elements mounted on the second surface of the first substrate, a second ground conductor connected to the first ground conductor, and a second signal conductor connected to the first signal conductor; a molded portion encapsulating the plurality of electronic elements mounted on the first surface of the first substrate; a shielding layer formed on outer surfaces of the molded portion and the first substrate and at least a portion of a side surface of the second substrate to shield electromagnetic waves; and an insulating layer disposed between the first and second substrates, wherein the shielding layer is connected to the second ground conductor of the second substrate.

The second ground conductor and the second signal conductor of the second substrate are at least disposed in a row, and the second ground conductor of the second substrate may include: a first connection conductor connected to the first ground conductor; an internal ground conductor formed on an internal layer of the second substrate and connected to the shielding layer; a second connection conductor formed for an external connection; and a conductor via connecting the first connection conductor, the internal ground conductor, and the second connection conductor to one another.

the second ground conductor and the second signal conductor of the second substrate are at least disposed in a row, and the second ground conductor may include:

a first connection conductor connected to the first ground conductor; a first internal ground conductor formed on a first internal layer of the second substrate; a second internal ground conductor formed on a second internal layer of the second substrate; a second connection conductor formed for an external connection; and a conductor via connecting the first connection conductor, the first internal ground conductor, the second internal ground conductor, and the second connection conductor to one another, at least one of the first and second internal ground conductors being connected to the shielding layer.

The second substrate includes a first shield via formed therein to be spaced apart from the shielding layer formed on the side surface of the substrate, and connecting the first and second internal ground conductors to each other.

The second substrate further includes a shield via disposed adjacently to the penetration part of the second substrate, the shielding via may include: a first conductor formed on the first internal layer; a second conductor formed on the second internal layer; and a second shield via connecting the first and second conductors to each other.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Hereinafter, exemplary embodiments of the present disclosure will be described in detail with reference to the accompanying drawings.

Figure 1:
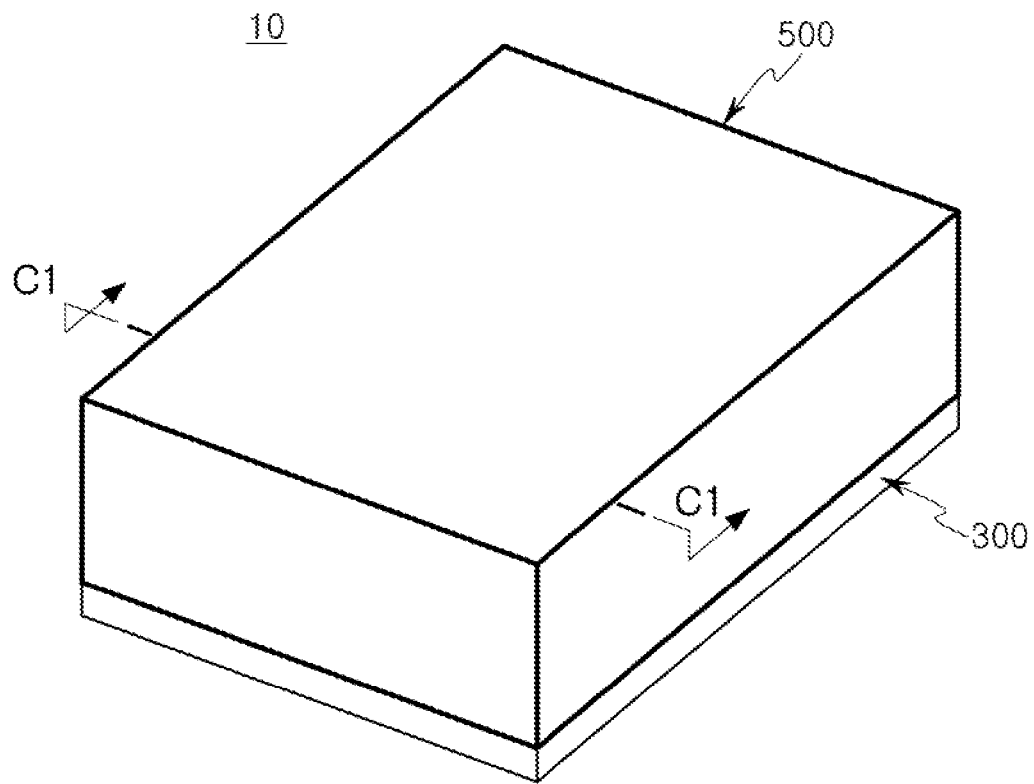
FIG. 1 is a perspective view illustrating an exterior of a semiconductor package according to an exemplary embodiment in the present disclosure.
Figure 2:
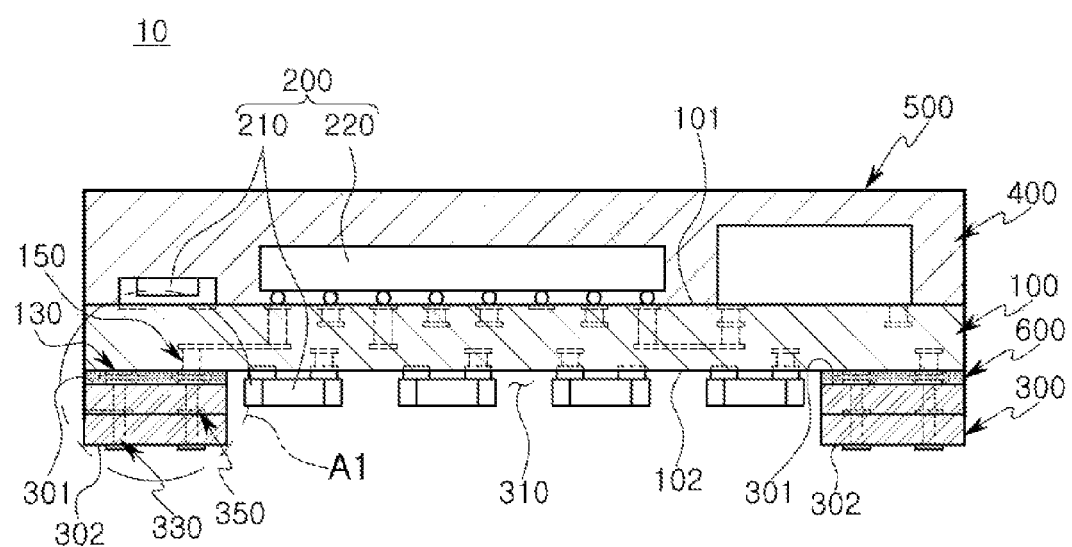
FIG. 2 is a cross-sectional view of the semiconductor package taken along line C1-C1 of FIG. 1.
Figure 3:
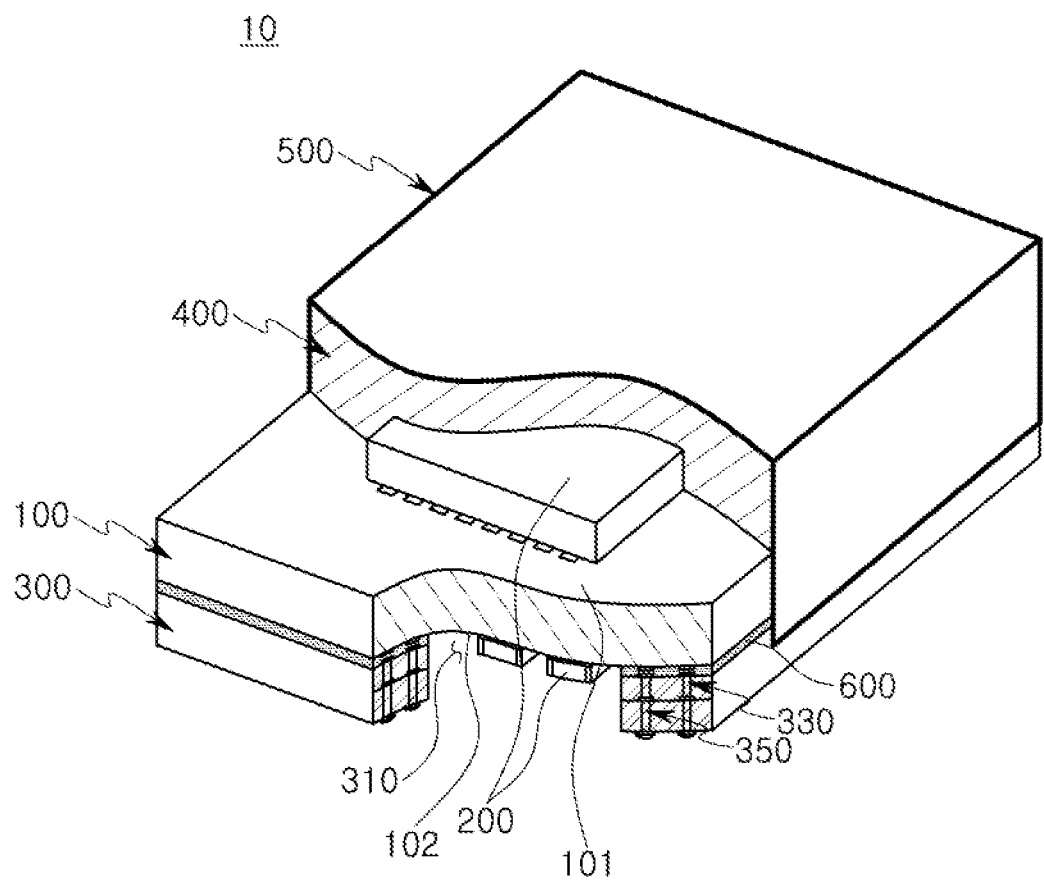
FIG. 3 is a partially cutaway perspective view illustrating an interior of the semiconductor package according to the exemplary embodiment in the present disclosure.

FIG. 1 is a perspective view illustrating an exterior of a semiconductor package according to an exemplary embodiment in the present disclosure, and FIG. 2 is a cross-sectional view of the semiconductor package taken along line C1-C1 of FIG. 1. FIG. 3 is a partially cutaway perspective view illustrating an interior of the semiconductor package according to the exemplary embodiment in the present disclosure.

Referring to FIGS. 1 through 3, a semiconductor package 10 according to the exemplary embodiment in the present disclosure may include a first substrate 100, a plurality of electronic elements 200, a second substrate 300, a molded portion 400, and a shielding layer 500.

Referring to FIGS. 2 and 3, the semiconductor package 10 according to the exemplary embodiment in the present disclosure may further include an insulating layer 600 disposed between the first and second substrates 100 and 300.

The first substrate 100 may be a double-sided substrate having first and second surfaces 101 and 102 opposing each other, and include a first ground conductor 130 disposed on at least a second surface 102. For example, the first surface 101 may be an upper surface of the first substrate 100, and the second surface 102 may be a lower surface of the first substrate 100.

Further, the first substrate 100 may include a first signal conductor 150 disposed on at least second 102.

The first substrate 100 according to the present exemplary embodiment may be a multi-layer substrate composed of a plurality of layers, and circuit patterns for forming electrical connections may be formed between each of the layers. In addition, the first substrate 100 according to the present exemplary embodiment may include circuit patterns formed in the first substrate 100 and a conductive via electrically connecting the circuit patterns to each other.

Further, a cavity (not illustrated) in which the electronic element 200 may be embedded may be formed in the first substrate 100 according to the present exemplary embodiment.

The plurality of electronic elements 200 may be mounted on the first surface and the second surface of the first substrate 100.

As an example, in a case in which the first substrate 100 includes the first signal conductor 100, the plurality of electronic elements 200 may be connected to the first signal conductor 150 (for example, a mounting pad).

The plurality of electronic elements 200 are not particularly limited, as long as they may be mounted on the substrate. For example, a component including a passive or active element, a circuit (for example, an integrated circuit (IC)), or a module may be mounted on each of the first and second surfaces 101 and 102 of the first substrate 100 as the electronic elements. As an example, the plurality of electronic elements 200 may include an integrated circuit (IC) such as a main IC, or the like, or a module such as a front end module (FEM), or the like.

The second substrate 300 may be adhered to the second surface 102 of the first substrate 100 and may include a penetration part 310 and a second ground conductor 330.

The penetration part 310 may be formed to accommodate the plurality of electronic elements 200 mounted on the second surface 102 of the first substrate 100 therein. The second ground conductor 330 may be connected to the first ground conductor 130.

The penetration part 310 may be used as a space in which the plurality of electronic elements 200 mounted on the second surface 102 of the first substrate 100 are accommodated. Therefore, the plurality of electronic elements 200 mounted on the second surface 102 of the first substrate 100 may be mounted at a position of the second surface 102 of the first substrate 100 facing the penetrating part 310 of the second substrate 300.

Further, the second substrate 300 may further include a second signal conductor 350. For example, in a case in which the first substrate 100 includes the first signal conductor 150, the second signal conductor 350 may be connected to the first signal conductor 150 of the first substrate 100.

The molded portion 400 may be formed to encapsulate the plurality of electronic elements 200 mounted on the first surface 101 of the first substrate 100.

As an example, the molded portion 400 may be filled between the plurality of electronic elements 200 mounted on the first substrate 100, thereby preventing an electric short-circuit from occurring between the plurality of electronic elements 200. In addition, the molded portion 400 may fix the plurality of electronic elements 200 onto the first substrate 100 while enclosing outer portions of the plurality of electronic elements 200, thereby safely protecting the plurality of electronic elements from external impacts.

The molded portion 400 as described above may be formed of an insulating material including a resin material such as an epoxy, or the like. As an example, the molded portion 400 according to the exemplary embodiment in the present disclosure may be formed by seating the first substrate 100 of which the plurality of electronic elements 200 are mounted on the first surface 101 in a mold (not illustrated) and injecting a molding resin into the mold. However, a method of forming the molded portion 400 is not limited thereto.

The shielding layer 500 may be formed on outer surfaces of the molded portion 400 and the first substrate 100 and at least a portion of a side surface of the second substrate 200, thereby shielding electromagnetic waves.

As an example, the shielding layer 500 may be connected to the second ground conductor 330 of the second substrate 300.

For example, the shielding layer 500 may be formed on the entire outer surface of the molded portion 400 and the entire side surface of the first substrate 200, and at least the portion of the side surface of the second substrate 300. As an example, the shielding layer 500 may be formed on the entire side surface of the second substrate 300 but is not limited thereto.

As an example, the shielding layer 500 may be electrically connected to a plurality of second ground conductors 330 formed in the second substrate 300, respectively.

The shielding layer 500 according to the exemplary embodiment in the present disclosure is not particularly limited to a specific material or raw material as long as it contains a material having conductivity. As an example, the shielding layer 500 may be formed of a resin material containing a conductive powder or formed of a separate metal thin film.

As an example, the shielding layer 500 may be formed using at least one of various methods such as a sputtering method, a vapor deposition method, a spray coating method, a screen printing method, an electroplating method, an electroless plating method, and the like. A method of forming the shielding layer 500 is not limited to the above-mentioned methods, and any method may be used as long as a conductive shielding film serving as the shielding layer 500 may be formed.

Figure 4:
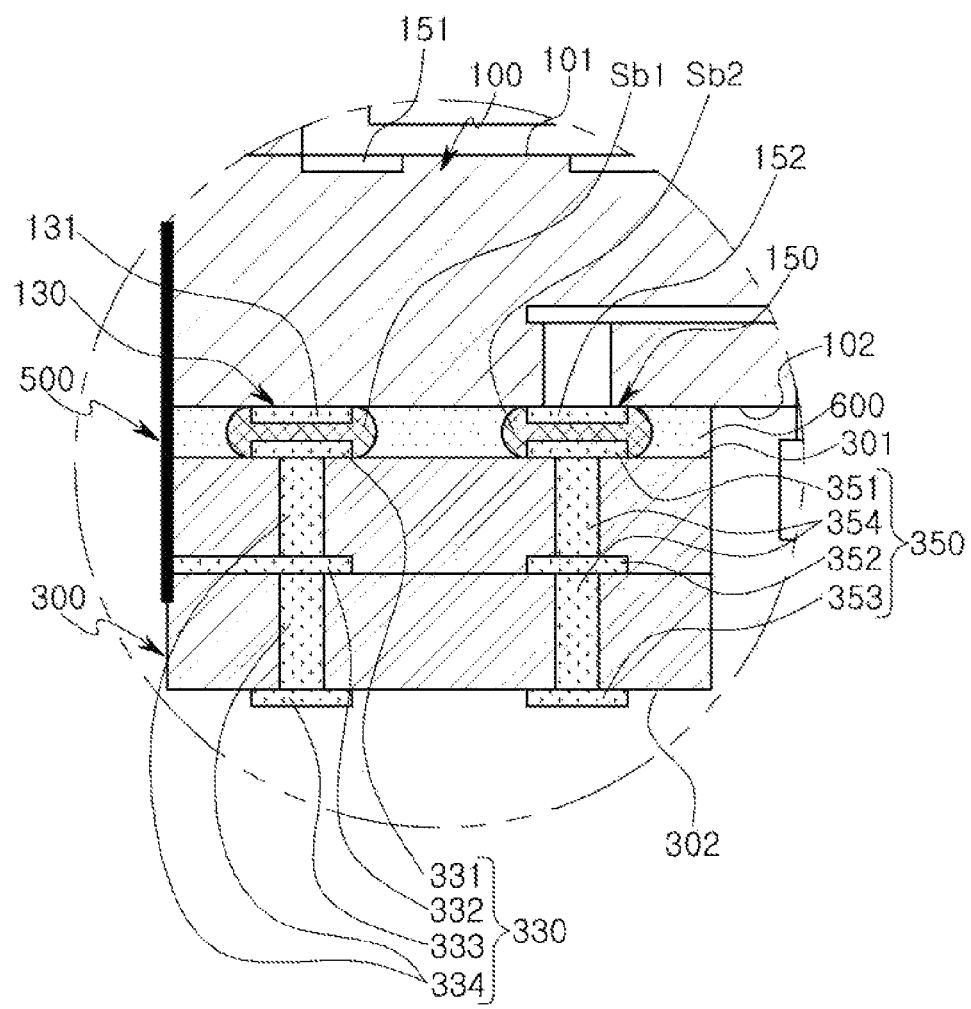
FIG. 4 is a partially enlarged view of part A1 of FIG. 2 illustrating a first example of the semiconductor package according to the exemplary embodiment in the present disclosure.

FIG. 4 is a partially enlarged view of part A1 of FIG. 2 illustrating a first example of the semiconductor package according to the exemplary embodiment in the present disclosure.

Referring to FIGS. 2 and 4, as an example, the first ground conductor 130 of the first substrate 100 may be formed in the first surface 101, the second surface 102, and the first substrate 100. In this case, the first ground conductor 130 may include a connection pad 131 for connection with the second substrate 300 adhered to the second surface 102.

Further, the first signal conductor 150 of the first substrate 100 may be formed in the first surface 101, the second surface 102, and the first substrate 100. In this case, the first signal conductor 150 may include a mounting pad 151 for connection with the plurality of electronic elements 200 mounted on the first surface 101 and a connection pad 152 for connection with the second substrate 300 adhered to the second surface 102.

Here, as the first substrate 1, various types of substrate (for example, a ceramic substrate, a printed circuit board, a flexible substrate, or the like) well known in the art may be used. In addition, although not illustrated, a wiring pattern for electrically connecting the mounting pads to each other, or the like, in addition to the mounting pad for mounting the plurality of electronic elements 200 may be formed on the first surface and the second surface of the first substrate 100.

Further, referring to FIG. 4, the second ground conductor 330 of the second substrate 300 may include a first connection conductor 331, an internal ground conductor 332, a second connection conductor 333, and a via conductor 334.

As an example, the second signal conductor 350 of the second substrate 300 may be formed in a first surface 301, a second surface 302, and the second substrate 300. In this case, the first connection conductor 331 may be formed on the first surface 301 of the second substrate 300 to thereby be connected to the first ground conductor 130 of the first substrate 100, and the internal ground conductor 332 may be formed on an internal layer LY of the second substrate 300 to thereby be connected to the shielding layer 500. For example, the first surface 301 may be an upper surface of the second substrate 300, and the second surface 302 may be a lower surface of the second substrate 300.

The second connection conductor 333 may be formed on the second surface 302 of the second substrate 300 to thereby be connected to the outside. As an example, the second connection conductor 333 may electrically and physically connect the semiconductor package 10 and a main board (not illustrated) on which the semiconductor package 10 is mounted to each other.

In addition, the conductor via 334 may connect the first connection conductor 331, the internal ground conductor 332, and the second connection conductor 333 to one another.

The second signal conductor 350 of the second substrate 300 may include a first connection conductor 351, an internal conductor 352, a second connection conductor 353, and a via conductor 354.

In this case, the first connection conductor 351 may be formed on the first surface 301 of the second substrate 300 to thereby be connected to the first substrate 100 adhered to the first surface 301 of the second substrate 300.

The internal conductor 352 may be formed on the internal layer LY of the second substrate 300 to thereby be connected to the first connection conductor 351.

The second connection conductor 353 may be formed on the second surface 302 of the second substrate 300 to thereby connect the semiconductor package 10 to an external electronic component or device. As an example, the second connection conductor 353 may electrically and physically connect the semiconductor package 10 and the main board (not illustrated) on which the semiconductor package 10 is mounted to each other.

In addition, the conductor via 354 may connect the first connection conductor 351, the internal conductor 352, and the second connection conductor 353 to one another.

Here, as the second substrate 300, various types of substrate (for example, a ceramic substrate, a printed circuit board, a flexible substrate, or the like) well known in the art may be used similarly to the first substrate 100. The second substrate 300 according to the present exemplary embodiment may be a multi-layer substrate composed of a plurality of layers, and circuit patterns (not illustrated) for forming electrical connections may be formed between each of the layers.

In addition, the second substrate 300 according to the present exemplary embodiment may be formed to a thickness thicker than a mounting height of the electronic element 200 mounted on the second surface 102 of the first substrate 100 in order to stably protect the electronic element 200 accommodated in the penetration part 310. However, the second substrate 300 is not limited thereto.

Figure 5A:
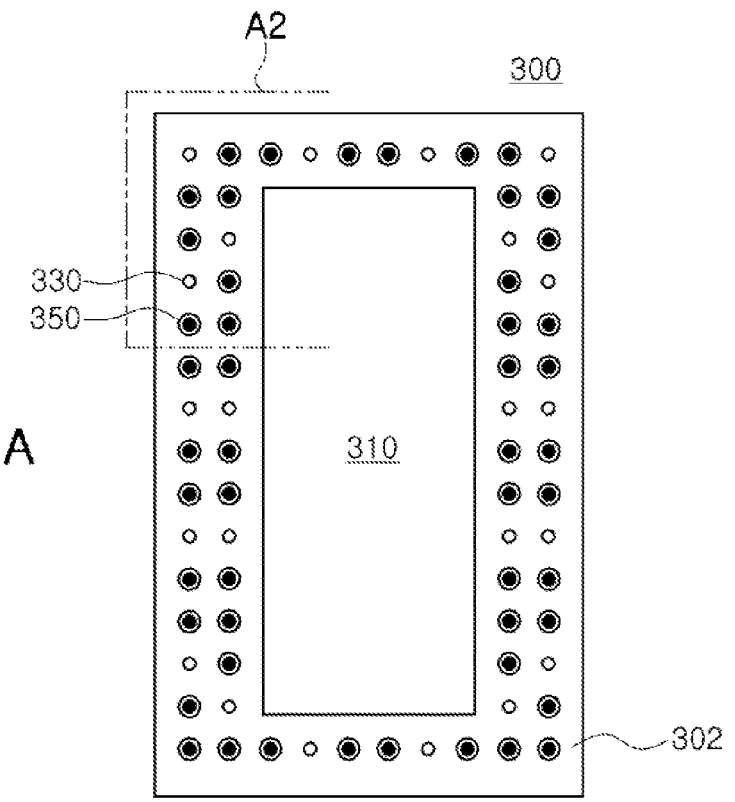
FIGS. 5A and 5B are a bottom view and a partially enlarged view of a second substrate of FIG. 4.
Figure 5B:
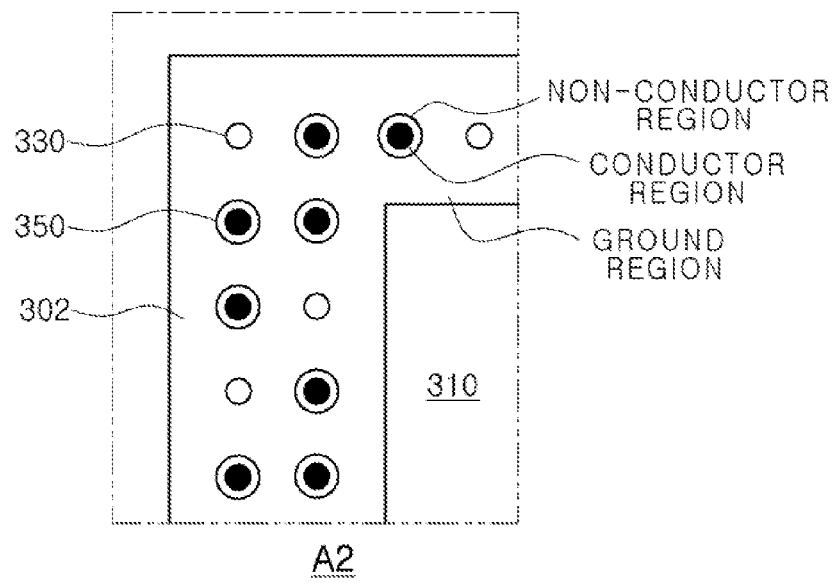

Therefore, a plurality of second connection conductors 333 of the second ground conductor 330 and a plurality of second connection conductors 353 of the second signal conductor 350 may be formed as illustrated in FIGS. 5A and 5B.

Further, the second connection conductor 333 of the second ground conductor 330 and the second connection conductor 353 of the second signal conductor 350, which are electrode pads formed on the second surface 302 of the second substrate 300, may be connected to the main board by a conductive adhesive member such as solder balls Sb1 and Sb2, a bump, or the like.

In addition, referring to FIGS. 2 and 4, the insulating layer 600 may be formed of an insulating material and filled between the first and second substrates 100 and 300 to protect the conductive adhesive member such as the solder balls Sb1 and Sb2 electrically connecting the first and second substrates 100 and 300 to each other, or the like. Further, the insulating layer 600 may improve adhesive force between the first and second substrates 100 and 300 while insulating the first and second substrates 100 and 300 from each other, thereby serving to improve reliability.

The insulating layer 600 as described above may be formed of an underfill resin. Therefore, a material of the insulating layer 600 may be an epoxy resin, or the like, but is not limited thereto.

In addition, although a case in which the insulating layer 600 is interposed between the first and second substrates 100 and 300 is described by way of example in the present exemplary embodiment, the insulating layer 600 is not limited thereto. That is, the insulating layer 600 may also be interposed in gaps between the first substrate 100 and the plurality of electronic elements 200 mounted on the second surface 102 of the first substrate 100. In this case, the insulating layer 600 may be entirely formed on the second surface 102 of the first substrate 100.

FIGS. 5A and 5B are a bottom view and a partially enlarged view of a second substrate of FIG. 4.

Referring to FIGS. 5A and 5B, the second ground conductor 330 and the second signal conductor 350 of the second substrate 300 may be disposed in at least one row.

As an example, the second ground conductor 330 and the second signal conductor 350 may be disposed in one row, in two rows, or in a mixed form of one row arrangement and two row arrangement, but the second ground conductor 330 and the second signal conductor 350 is not limited to a specific arrangement form.

Further, referring to the second surface 302 of the second substrate 300, a ground region may be formed on the second surface 302 of the second substrate 300 to thereby be connected to the second ground conductor 330. In addition, an internal conductor region in the second signal conductor 350 may be electrically separated from the ground region of the second surface 302 by a non-conductor region around the internal conductor region.

Figure 6:
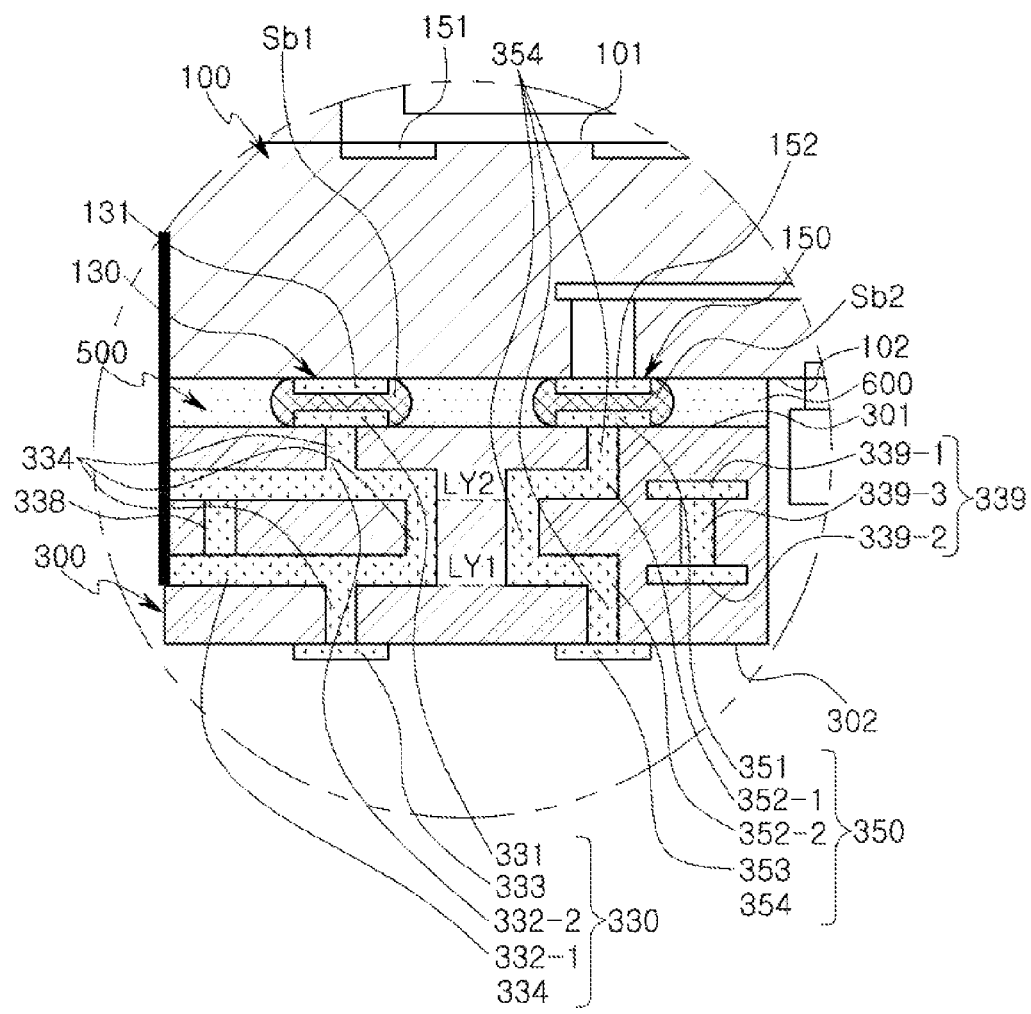
FIG. 6 is a partially enlarged view of part A1 of FIG. 2 illustrating a second example of the semiconductor package according to the exemplary embodiment in the present disclosure.

FIG. 6 is a partially enlarged view of part A1 of FIG. 2 illustrating a second example of the semiconductor package according to the exemplary embodiment in the present disclosure.

In describing the semiconductor package 10 illustrated in FIG. 6, an overlapping description of contents the same as those described above with reference to FIG. 4 will be omitted.

Referring to FIG. 6, a second ground conductor 330 of the second substrate 300 according to the exemplary embodiment in the present disclosure may include a first connection conductor 331, a first internal ground conductor 332-1, a second internal ground conductor 332-2, a second connection conductor 333, and a conductor via 334.

As an example, the second signal conductor 350 of the second substrate 300 may be formed in a first surface 301, a second surface 302, and the second substrate 300. In this case, the first connection conductor 331 may be formed on the first surface 301 of the second substrate 300 to thereby be connected to the first ground conductor 130 of the first substrate 100.

The first internal ground conductor 332-1 may be formed on a first internal layer LY1 of the second substrate 300, and the second internal ground conductor 332-2 may be formed on a second internal layer LY2 of the second substrate 300. Here, at least one of the first and second internal ground conductors 332-1 and 332-2 may be connected to the shielding layer 500.

The second connection conductor 333 may be formed on the second surface 302 of the second substrate 300 to thereby be connected to the outside. As an example, the second connection conductor 333 may electrically and physically connect the semiconductor package 10 and a main board (not illustrated) on which the semiconductor package 10 is mounted.

In addition, the conductor via 334 may connect the first connection conductor 331, the first and second internal ground conductors 332-1 and 332-2, and the second connection conductor 333 to one another.

Here, the second substrate 300 may have a structure composed of at least three layers, and have a structure composed of four layers as illustrated in FIG. 6, but is not limited thereto.

A second signal conductor 350 of the second substrate 300 may include a first connection conductor 351, a first internal conductor 352-1, a second internal conductor 352-2, a second connection conductor 353, and a via conductor 354.

In this case, the first connection conductor 351 may be formed on the first surface 301 of the second substrate 300 to thereby be connected to the first substrate 100 adhered to the first surface 301 of the second substrate 300.

The first internal conductor 352-1 may be formed on the first internal layer LY1 of the second substrate 300, and the second internal conductor 352-2 may be formed on the second internal layer LY2 of the second substrate 300 to thereby be connected to the first connection conductor 351.

The second connection conductor 353 may be formed on the second surface 302 of the second substrate 300 to thereby be connected to an external electronic component or device. As an example, the second connection conductor 353 may electrically and physically connect the semiconductor package 10 and the main board (not illustrated), on which the semiconductor package 10 is mounted, to each other.

In addition, the conductor via 354 may connect the first connection conductor 351, the first and second internal conductors 352-1 and 352-2, and the second connection conductor 353 to one another.

Figure 7A:
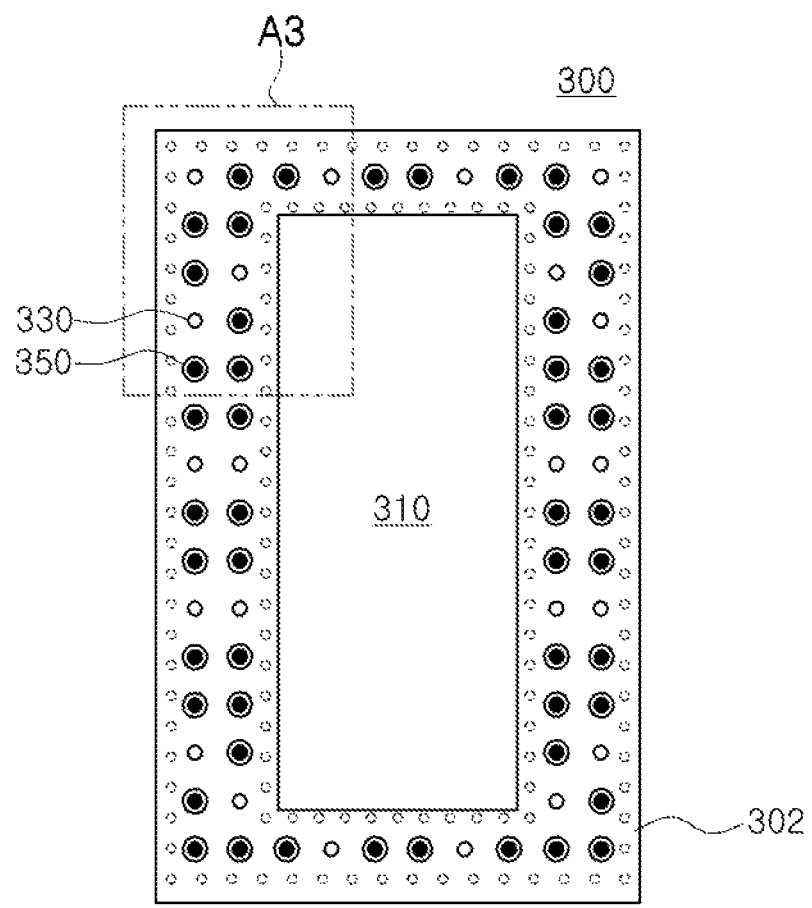
FIGS. 7A and 7B are a bottom view and a partially enlarged view of a second substrate of FIG. 6.
Figure 7B:
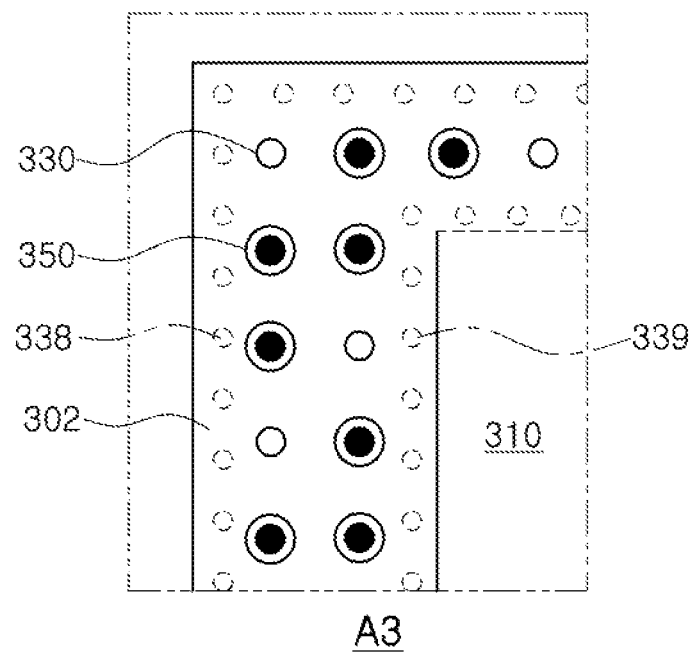

Therefore, a plurality of second connection conductors 333 of the second ground conductor 330 and a plurality of second connection conductors 353 of the second signal conductor 350 may be formed as illustrated in FIGS. 7A and 7B.

Further, referring to FIG. 6, the second substrate 300 may further include a first shielding via 338.

The first shielding via 338 may be formed in the second substrate 300 to be spaced apart from the shielding layer 500 formed on the side surface of the second substrate 300, thereby connecting the first and second internal ground conductors 332-1 and 332-2 to each other.

In this case, even though a connection failure occurs between any one of the first and second internal ground conductors 332-1 and 332-2 and the shielding layer 500, the first and second internal ground conductors 332-1 and 332-2 may be connected to each other by the first shielding via 338, thereby increasing electromagnetic wave shielding efficiency.

In addition, the second substrate 300 may further include a shielding conductor 339 disposed adjacently to the penetration part 310 of the second substrate 300 in order to block electromagnetic waves from entering thereinto.

As an example, the shielding conductor 339 may include a first conductor 339-1, a second conductor 339-2, and a second shielding via 339-3.

The first conductor 339-1 may be formed on the first internal layer LY1 of the second substrate 300, and the second conductor 339-2 may be formed on the second internal layer LY2 of the second substrate 300. In addition, the second shielding via 339-3 may connect the first and second conductors 339-1 and 339-2.

A plurality of shielding conductors 339 as described above may be disposed between the penetration part 310 of the second substrate 300 and the second signal conductor 350 or between the penetration part 310 of the second substrate 300 and the second ground conductor 330 in the second substrate 300.

The shielding conductor 339 as described above may be electrically connected to the second ground conductor 330 of the second substrate 100.

A plurality of first shield vias 338 and a plurality of shield conductors 339 as described above may be formed as illustrated in FIGS. 7A and 7B.

FIGS. 7A and 7B are a bottom view and a partially enlarged view of a second substrate of FIG. 6.

In describing the semiconductor package 10 illustrated in FIGS. 7A and 7B, an overlapping description of contents the same as those described above with reference to FIGS. 5A and 5B will be omitted.

Referring to FIGS. 7A and 7B, the plurality of first shield vias 338 may be disposed in internal positions of the second substrate 300 adjacent to an outer side surface of the second substrate 100. The first shielding via 338 as described above may reliably ensure connection between the shield conductor 339 and the second ground conductor 330 of the second substrate 300, thereby increasing a shielding effect.

Further, the plurality of shielding conductors 339 may be formed in internal positions of the second substrate 300 adjacent to an inner side surface of the second substrate 300, that is, an inner side surface of the second substrate 300 facing the penetration part 310. The shielding conductor 339 as described above may increase a shielding effect between the electronic elements accommodated in the penetration part 310 and the second signal conductor 350 of the second substrate 300.

The first shield vias 338 and the shield conductors 339 are not be directly exposed and may be formed in plural as illustrated in FIGS. 7A and 7B.

In this case, the first shield via 338 and the shield conductor 339 are not directly exposed in bottom surfaces of FIGS. 7A and 7B, but positions thereof are illustrated in order to show spatial disposition thereof.

According to the exemplary embodiment in the present disclosure described above, in the double-sided mounting type semiconductor package which is advantageous for miniaturization and lightness, the shielding layer may be formed on the outer surfaces of the molded portion formed of the epoxy, or the like, which is the encapsulant material, the first substrate, and the second substrate, and the shielding layer may be connected to the internal ground conductor of the second substrate, such that the shielding effect may be improved.

As set forth above, according to exemplary embodiments in the present disclosure, the semiconductor package of which electromagnetic characteristics are improved in the double-sided mounting type semiconductor package may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a first substrate including a first surface and a second surface opposing each other, and a first ground conductor disposed on at least the second surface among the first surface and the second surface;
a plurality of electronic elements mounted on the first surface and the second surface of the first substrate;
a second substrate adhered to the second surface of the first substrate, the second substrate including a penetration part formed to accommodate the plurality of electronic elements mounted on the second surface of the first substrate, and the second substrate including a second ground conductor connected to the first ground conductor;
a molded portion encapsulating the plurality of electronic elements mounted on the first surface of the first substrate; and
a shielding layer formed on outer surfaces of the molded portion and the first substrate and at least a portion of a side surface of the second substrate to shield electromagnetic waves,
wherein the shielding layer is connected directly to the second ground conductor of the second substrate.

2. The semiconductor package of claim 1, wherein the second ground conductor of the second substrate includes:
a first connection conductor connected to the first ground conductor;
an internal ground conductor formed on an internal layer of the second substrate and connected to the shielding layer;
a second connection conductor formed for an external connection; and
a conductor via connecting the first connection conductor, the internal ground conductor, and the second connection conductor to one another.

3. The semiconductor package of claim 1, wherein the second ground conductor of the second substrate includes:
a first connection conductor connected to the first ground conductor;
a first internal ground conductor formed on a first internal layer of the second substrate;
a second internal ground conductor formed on a second internal layer of the second substrate;
a second connection conductor formed for an external connection; and
a conductor via connecting the first connection conductor, the first internal ground conductor, the second internal ground conductor, and the second connection conductor to one another,
at least one of the first and second internal ground conductors being connected to the shielding layer.

4. The semiconductor package of claim 3, wherein the second substrate includes a first shield via formed therein to be spaced apart from the shielding layer formed on the side surface of the substrate, and connecting the first and second internal ground conductors to each other.

5. The semiconductor package of claim 3, wherein the second substrate further includes a shield via disposed adjacently to the penetration part of the second substrate, the shielding via including:
a first conductor formed on the first internal layer;
a second conductor formed on the second internal layer; and
a second shield via connecting the first and second conductors to each other.

6. A semiconductor package comprising:
a first substrate including a first surface and a second surface opposing each other, and a first ground conductor and a first signal conductor which are separately formed on at least the second surface among the first surface and the second surface of the first substrate;
a plurality of electronic elements mounted on the first surface and the second surface of the first substrate to thereby be connected to the first signal conductor;
a second substrate adhered to the second surface of the first substrate, the second substrate including a penetration part formed to accommodate the plurality of electronic elements mounted on the second surface of the first substrate, and the second substrate including a second ground conductor and a second signal conductor formed separately from each other in the second substrate, the second ground conductor connected to the first ground conductor, and the second signal conductor connected to the first signal conductor;
a molded portion encapsulating the plurality of electronic elements mounted on the first surface of the first substrate;
a shielding layer formed on outer surfaces of the molded portion and the first substrate and at least a portion of a side surface of the second substrate to shield electromagnetic waves; and
an insulating layer disposed between the first and second substrates,
wherein the shielding layer is connected directly to the second ground conductor of the second substrate.

7. The semiconductor package of claim 6, wherein the second ground conductor and the second signal conductor of the second substrate are at least disposed in a row, and
the second ground conductor of the second substrate includes:
a first connection conductor connected to the first ground conductor;
an internal ground conductor formed on an internal layer of the second substrate and connected to the shielding layer;
a second connection conductor formed for an external connection; and
a conductor via connecting the first connection conductor, the internal ground conductor, and the second connection conductor to one another.

8. The semiconductor package of claim 6, wherein the second ground conductor and the second signal conductor of the second substrate are at least disposed in a row, and
the second ground conductor includes:
a first connection conductor connected to the first ground conductor;
a first internal ground conductor formed on a first internal layer of the second substrate;
a second internal ground conductor formed on a second internal layer of the second substrate;
a second connection conductor formed for an external connection; and
a conductor via connecting the first connection conductor, the first internal ground conductor, the second internal ground conductor, and the second connection conductor to one another,
at least one of the first and second internal ground conductors being connected to the shielding layer.

9. The semiconductor package of claim 8, wherein the second substrate includes a first shield via formed therein to be spaced apart from the shielding layer formed on the side surface of the substrate, and connecting the first and second internal ground conductors to each other.

10. The semiconductor package of claim 8, wherein the second substrate further includes a shield via disposed adjacently to the penetration part of the second substrate, the shielding via including:
a first conductor formed on the first internal layer;
a second conductor formed on the second internal layer; and
a second shield via connecting the first and second conductors to each other.

\* \* \* \* \*